US008502198B2

United States Patent
Williams et al.

(10) Patent No.: US 8,502,198 B2
(45) Date of Patent: Aug. 6, 2013

(54) SWITCHING DEVICE AND METHODS FOR CONTROLLING ELECTRON TUNNELING THEREIN

(75) Inventors: R. Stanley Williams, Palo Alto, CA (US); Zhiyong Li, Palo Alto, CA (US); Douglas Ohlberg, Palo Alto, CA (US); Philip J. Kuekes, Palo Alto, CA (US); Duncan Stewart, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1608 days.

(21) Appl. No.: 11/414,578

(22) Filed: Apr. 28, 2006

(65) Prior Publication Data

US 2007/0252128 A1    Nov. 1, 2007

(51) Int. Cl.
*H01L 29/08*    (2006.01)
(52) U.S. Cl.
USPC ... 257/40; 257/2; 257/3; 257/4; 257/E45.002; 257/E51.003; 257/E51.13
(58) Field of Classification Search
USPC ............ 257/2–4, 40, E45.002, E51.003, 257/13
See application file for complete search history.

(56) References Cited

U.S. PATENT DOCUMENTS

| 6,128,214 | A | 10/2000 | Kuekes et al. |
| 6,198,655 | B1 | 3/2001 | Heath et al. |
| 6,903,366 | B2 | 6/2005 | Heath et al. |
| 6,927,411 | B2 | 8/2005 | Kozicki |
| 6,972,427 | B2 | 12/2005 | Roehr et al. |
| 6,985,378 | B2 | 1/2006 | Kozicki |
| 2004/0159835 | A1* | 8/2004 | Krieger et al. ................ 257/40 |
| 2005/0227071 | A1 | 10/2005 | Muraoka et al. |

OTHER PUBLICATIONS

Richter, Electrical characterization of Al/AlOx/molecule/Ti/Al devices, Appl. Phys. A80, 1355-1362, 2005.*

* cited by examiner

*Primary Examiner* — Minchul Yang

(57) ABSTRACT

A switching device includes at least one bottom electrode and at least one top electrode. The top electrode crosses the bottom electrode at a non-zero angle, thereby forming a junction. A metal oxide layer is established on at least one of the bottom electrode or the top electrode. A molecular layer including a monolayer of organic molecules and a source of water molecules is established in the junction. Upon introduction of a forward bias, the molecular layer facilitates a redox reaction between the electrodes, thereby reducing a tunneling gap between the electrodes.

15 Claims, 5 Drawing Sheets

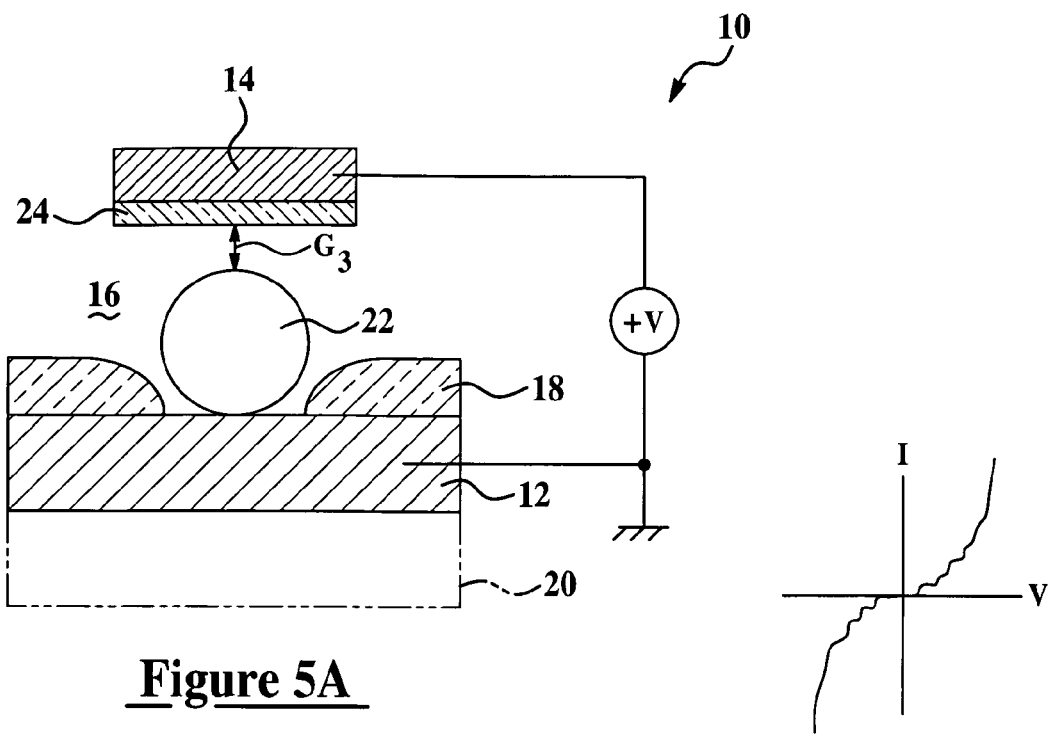
Figure 5A
Figure 5B
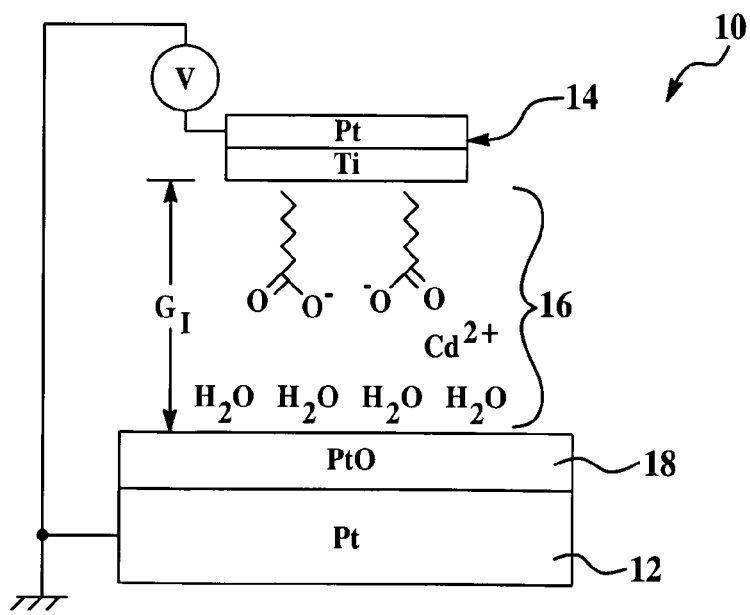
Figure 6A

SWITCHING DEVICE AND METHODS FOR CONTROLLING ELECTRON TUNNELING THEREIN

BACKGROUND

The present disclosure relates generally to switching devices and to methods for controlling electron tunneling within the switching devices; and more particularly to switching devices and methods based on electron tunneling modulation at an interface of the device using nanoparticles and electrochemical reactions.

Electronic switching devices including two electrodes (for example, a bottom electrode and a top electrode) and an electronic switching layer/film at the junction of the two electrodes are known. Such devices may be useful, for example, in the fabrication of devices based on electrical switching, such as molecular wire crossbar interconnects for signal routing and communications, molecular wire crossbar memory, molecular wire crossbar logic employing programmable logic arrays, multiplexers/demultiplexers for molecular wire crossbar networks, molecular wire transistors, and the like. Such devices may further be useful, for example, in the fabrication of devices based on optical switching, such as displays, electronic books, rewritable media, electrically tunable optical lenses, electrically controlled tinting for windows and mirrors, optical crossbar switches (for example, for routing signals from one of many incoming channels to one of many outgoing channels), and the like.

The switching layer/film at the junction of the electrodes enables switching between an on and off state. Mechanical movement of bistable molecular structures, direct redox of molecules, and dipole change of molecules have been proposed for switching mechanisms in molecular scale switching devices. In such approaches, the molecules in the junction are often attributed solely for the electronic property of the devices, whereas the functions of the electrode/molecule films interfaces are often ignored.

SUMMARY

A switching device is disclosed herein. The switching device includes at least one bottom electrode and at least one top electrode. The top electrode(s) crosses the bottom electrode(s) at a non-zero angle, thereby forming a junction. A metal oxide layer is established on at least one of the bottom electrode(s) or the top electrode(s). A molecular layer including a monolayer of organic molecules and a source of water molecules is established in the junction. Upon introduction of a forward bias, the molecular layer facilitates a redox reaction between the electrodes, thereby reducing a tunneling gap between the electrodes.

BRIEF DESCRIPTION OF THE DRAWINGS

Features and advantages of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

FIG. 5A is a schematic diagram of an alternate embodiment of the switching device depicted in FIG. 1A after a forward bias has been applied for a predetermined time longer than the predetermined time of FIG. 3A;

FIG. 5B is a graph depicting expected current versus voltage results for the device shown in FIG. 5A;

FIG. 6A is a schematic diagram of an example embodiment of the switching device;

DETAILED DESCRIPTION

Embodiments of the present disclosure advantageously provide a molecular scale switching device suitable for use in a variety of electronic and/or optical devices. As used herein, the term "molecular scale" ranges from about 5 angstroms to about 10 nm. The switching device is based on modulating the electron tunneling at a gap by initiating an electrochemical redox reaction at an electrode/molecule interface, thereby controlling electron transport through the gap. Embodiments of the switching device advantageously increase electron tunneling between top and bottom electrodes when a forward bias is applied. Upon introduction of the forward bias, a junction (formed by the electrodes and a molecular layer located therebetween) is capable of having a redox reaction induced therein. It is believed that the gap between the two electrodes of the device, which includes an interfacial layer and a molecular layer, plays a key role for controlling the electronic property of the whole device.

It is further believed that the reduction portion of the redox reaction facilitates formation of one or more metal nanoparticles that partially bridge the gap between the two electrodes, thereby advantageously increasing electron tunneling. Furthermore, the electron tunneling in embodiments of the switching device may advantageously be controlled by varying the voltage of the forward bias and/or the amount of time the forward bias is applied.

Figure 1A:
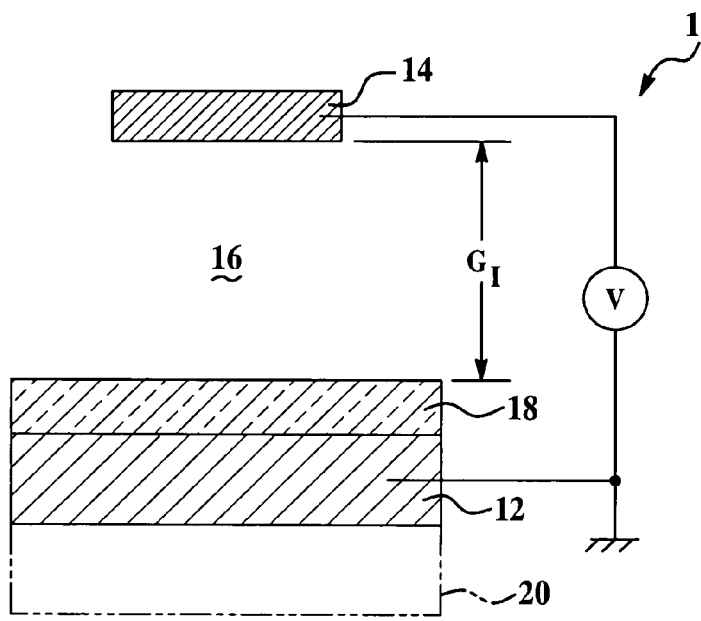
FIG. 1A is a schematic diagram of an embodiment of a switching device.

Referring now to FIG. 1A, an embodiment of the switching mechanism/device 10 is depicted. Generally, the device 10 includes at least one bottom electrode 12 and at least one top electrode 14 crossing the bottom electrode 12 at a non-zero angle to form an intersection, or a junction. Located in the junction is a molecular layer 16 including a monolayer of organic molecules and a source of water molecules.

It is to be understood that the terms "top electrode" and "bottom electrode" are not intended to be limited to, nor necessarily meant to convey a spatial orientation, but rather are used for illustrative purposes to differentiate two opposed electrodes in any spatial orientation (top, bottom, side, angularly offset, and/or the like). However, it is to be understood that in fabrication situations, "top" and "bottom" may signify a specific spatial orientation as defined by, e.g., planar deposition processes.

The electrodes 12, 14 may be made of any suitable electrode material. Such materials include, but are not limited to metallic elements, metallic compounds, metallic alloys, semiconducting elements, semiconducting compounds, semiconducting alloys, conductive organic compounds, and combinations thereof. Specific non-limitative examples of the electrode materials include platinum, aluminum, molybdenum, tungsten, palladium, titanium, chromium, gold, silicon, germanium, indium phosphide, gallium arsenide, silicon germanium, or combinations thereof.

One or both of the top and bottom electrodes 12, 14 may have established thereon a metal oxide layer 18. It is to be understood that the metal oxide layer 18 is established so that it faces the junction. Non-limitative examples of the metal oxide layer 18 include platinum oxide, palladium oxide, nickel oxide, copper oxide, silver oxide, or the like, or combinations thereof. The metal oxide layer 18 may be established via any suitable deposition technique, including, but not limited to plasma enhanced chemical vapor deposition (PECVD), physical vapor deposition (PVD) (e.g. sputtering or evaporation), spin-on-glass depositions, low temperature chemical vapor depositions (CVD), or atomic layer depositon (ALD).

As previously indicated, the molecular layer 16 is in the junction between the electrodes 12, 14. The thickness of the molecular layer 16 is generally equal to or less than about 5 nm. In a non-limitative example, the molecular layer 16 thickness ranges from about 1 nm to about 5 nm. Alternately, the thickness of the molecular layer 16 ranges from about 2 nm to about 3 nm. The thickness of the molecular layer 16 is substantially the same height as the initial electron tunneling gap $G_I$ between the electrodes 12, 14.

The molecular layer 16 includes a monolayer of organic molecules. Non-limitative examples of organic molecules include aliphatic acids, halogenated aliphatic acid derivatives, mercapto derivatives, phosphate derivatives, monochlorosilanones, tri-chlorosilanones, or combinations thereof. In an embodiment, the monolayer of organic molecules is a fatty acid. In this embodiment, the molecular layer 16 further includes an ion having a charge that is counter to the charge of the selected fatty acid. Non-limitative examples of such ions include cadmium cations (e.g., $Cd^{2+}$), calcium cations, copper cations, zinc cations, mercury cations, and combinations thereof.

The molecular layer 16 further includes a source of water molecules. The source of the water molecules may be water molecules located in the junction or water molecules located in an ambient environment in which the junction is located.

FIG. 1A also depicts the bottom electrode 12 established on a substrate 20. It is to be understood that any suitable substrate material may be used, and in an embodiment, the substrate 20 is silicon, glass, polymeric materials (non-limitative examples of which include poly(ethylene terephthalate) (PET), polyimides, polyesters, polyethylene naphthalate (PEN), polyethersulfone (PES), or the like), III-V or II-VI semiconductors, or the like, or combinations thereof.

Figure 1B:
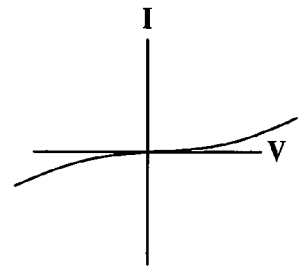
FIG. 1B is a graph depicting expected current versus voltage results for the device shown in FIG. 1A.
Figure 2:
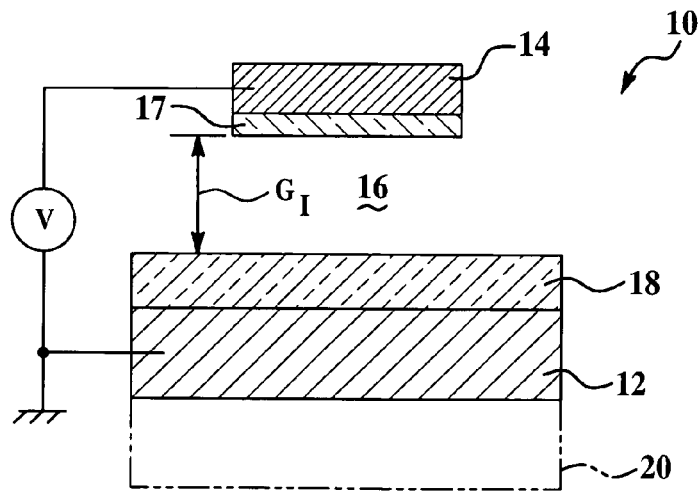
FIG. 2 is a schematic diagram of an alternate embodiment of a switching device, having an interfacial layer on one of the electrodes.
Figure 3A:
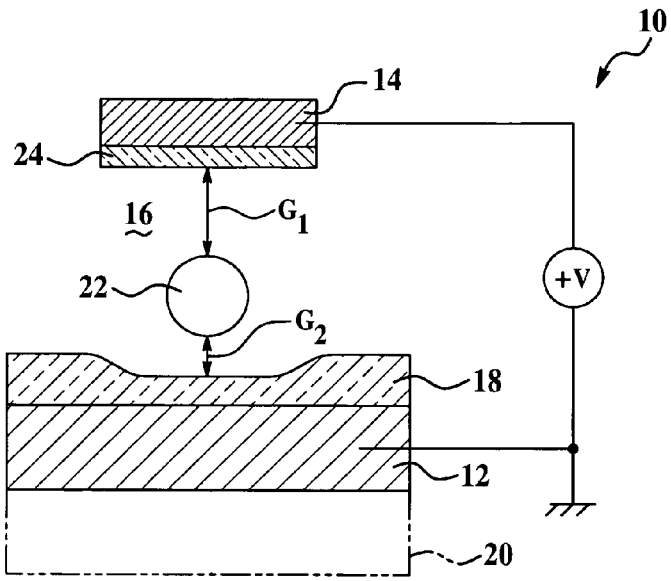
FIG. 3A is a schematic diagram of the switching device depicted in FIG. 1A after a forward bias has been applied for a predetermined time.
Figure 4A:
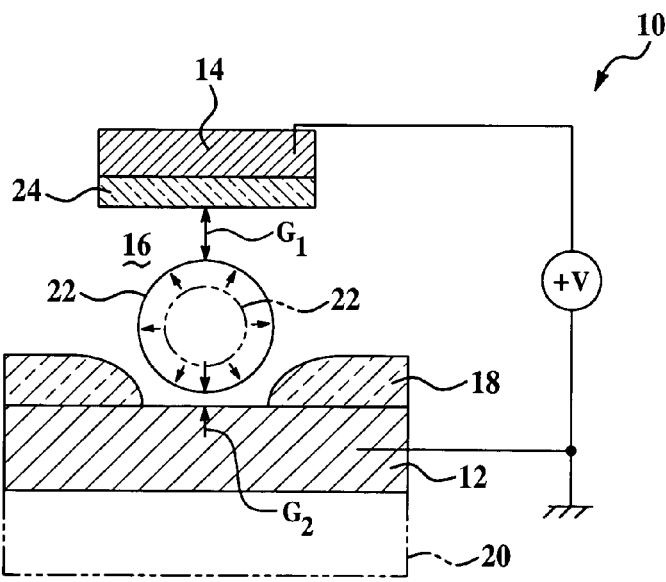
FIG. 4A is a schematic diagram of the switching device depicted in FIG. 1A after a forward bias has been applied for a predetermined time longer than the predetermined time of FIG. 3A.

FIG. 1B is a graph depicting the expected current versus voltage results for the device shown in FIG. 1A. It is to be understood that the device 10 depicted in FIGS. 1A and 2 are alternate embodiments of the device 10 before a forward bias is applied. FIGS. 3A, 4A, and 5A illustrate the device 10 of FIG. 1A after a forward bias has been applied for different predetermined times.

Generally, upon introduction of a forward bias, the molecular layer 16 facilitates a redox reaction between the bottom electrode 12 and the top electrode 14. More specifically, when an appropriate voltage is applied across the electrodes 12, 14, the molecular layer 16 facilitates a reduction reaction near one electrode 12, 14 (e.g., at an interface between the electrode 12, 14 and the metal oxide layer 18) and an oxidation reaction near the other electrode 14, 12 (e.g., at an interface between the electrode 14, 12 and the molecular layer 16). When a molecule is oxidized (reduced), then a second species is reduced (oxidized) so that the charge is balanced (see equations 1 and 2 below). It is to be understood that (as shown in FIGS. 3A, 4A and 5A) the reduction reaction occurs at the metal oxide layer 18. This reaction results in the formation of at least one metal nanoparticle 22 in a portion of the junction, thereby reducing the initial tunneling gap $G_I$ and increasing electron tunneling across the junction. In these embodiments, the oxidation reaction occurs near the electrode 14, 12 opposed to the metal oxide layer 18.

Referring now to FIG. 2, an alternate embodiment of the device 10 is shown. In this embodiment, at an interface between the molecular layer 16 and the top electrode 14 (or whichever of the two electrodes 12, 14 is suitable for the oxidation reaction), an interfacial layer 17 may be established. This interfacial layer 17 has trapping states (i.e., non-saturated bonds) that, under appropriate bias, will undergo a redox reaction. A non-limitative of such an interfacial layer 17 is a non-stoichiometric metal oxide, such as, for example, titanium oxides (e.g. $TiO_2$, TiO, $TiO_x$), tungsten oxides, vanadium oxides, nickel oxides, or the like, or combinations thereof.

Referring now to FIG. 3A, the device 10 of FIG. 1A is shown after the forward bias has been applied for a predetermined time. In this embodiment, the top electrode 14 is a material that is capable of forming a conductive oxide 24 upon initiation of the oxidation portion of the redox reaction. A non-limitative example of such a top electrode 14 is tin oxide doped with indium.

The oxidation reaction, generally occurring at an area opposed to the metal oxide layer 18 may be defined by the following chemical equation:

$$EM-4e^-+4OH^-\rightarrow EMO_2+2H_2O \qquad (Eqn. 1)$$

where the metal from the electrode (EM) reacts with hydroxide ions ($OH^-$) and loses electrons ($e^-$) to form a metal oxide ($EMO_2$) and water.

The reduction reaction, taking place at the metal oxide layer 18, may generally be defined by the following chemical equation:

$$MO+2e^-+H_2O\rightarrow M+2OH^- \qquad (Eqn. 2)$$

where the metal oxide (MO) reacts with electrons ($e^-$) and water to form the metal nanoparticle (M) and hydroxide ions ($OH^-$). It is to be understood that a plurality of metal nanoparticles 22 may be formed. In an embodiment with a plurality of nanoparticles 22, the nanoparticles 22 have a tendency to aggregate to form a larger, substantially spherical cluster of nanoparticles 22.

As depicted in FIG. 3A, the nanoparticle 22 may position itself so that it is adjacent neither the bottom electrode 12 nor the top electrode 14. The nanoparticle 22 in this embodiment divides the initial tunneling gap $G_I$ into two segments $G_1$, $G_2$, which together form a substantially reduced tunneling gap when compared to initial tunneling gap $G_I$ (shown in FIG. 1A).

It is believed that the diameter of the nanoparticle(s) 22 increases with an increase in voltage and/or an increase in the time of exposure to voltage. It is further believed that the current traveling through the tunneling gap (i.e., the rate of charge transport across the junction) increases exponentially as the diameter of the nanoparticle(s) 22 increases and the initial tunneling gap $G_I$ decreases. As such, the formation of the nanoparticle(s) 22 in the junction substantially increases electron tunneling through the gap when the device 10 is in operation. Furthermore, the ability to control the size of the nanoparticle 22 advantageously allows the electron tunneling to be tuned as desired.

Figure 3B:
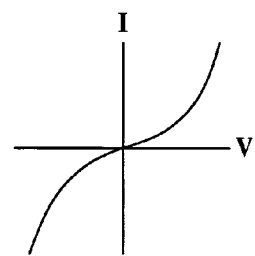
FIG. 3B is a graph depicting expected current versus voltage results for the device shown in FIG. 3A.

FIG. 3B illustrates the expected current versus voltage results for the device shown in FIG. 3A, which has had voltage applied for a first predetermined time. As depicted, the current to voltage characteristics are substantially non-linear, and the current increases as the forward bias voltage increases.

Referring now to FIG. 4A, an embodiment of the device 10 from FIG. 1A is shown after a forward bias has been applied for a second predetermined time. It is to be understood that this second predetermined time is longer than the forward bias application time shown in FIG. 3A.

As the voltage application time increases, the redox reaction continues. The oxidation reaction continues to increase the layer of the conductive oxide 24 forming adjacent the top electrode 14. The reduction reaction at the metal oxide layer 18 continues to increase the size/diameter of the nanoparticle (s) 22 as it decreases the thickness of the metal oxide layer 18 (compare FIGS. 3A and 4A). The nanoparticle 22 (shown in phantom in FIG. 4A) as it is depicted in FIG. 3A is shown in the center of the nanoparticle 22 of FIG. 4A simply to illustrate the growth of the nanoparticle(s) 22 over time as voltage is applied to the device 10.

Figure 4B:
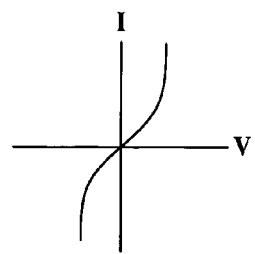
FIG. 4B is a graph depicting expected current versus voltage results for the device shown in FIG. 4A.

The increase in the size of the nanoparticle(s) 22 further reduces the tunneling gap (in this embodiment, gap segments $G_1$, $G_2$) between the electrodes 12, 14, thereby further increasing the electron tunneling across the junction. FIG. 4B illustrates the expected current versus voltage results for the device shown in FIG. 4A, which has had voltage applied for a second predetermined time. As shown, the current to voltage characteristics are substantially non-linear, and the current increases as the forward bias increases.

Referring now to FIG. 5A, an alternate embodiment of the device 10 from FIG. 1A is shown after a forward bias has been applied for a second predetermined time. It is to be understood that this second predetermined time is longer than the forward bias application time shown in FIG. 3A.

As previously stated, as the voltage application time increases, the redox reaction continues. The oxidation reaction continues to increase the layer of the conductive oxide 24 forming adjacent the top electrode 14. The reduction reaction at the metal oxide layer 18 continues to increase the size/diameter of the nanoparticle(s) 22 as it decreases the thickness of the metal oxide layer 18 (compare FIGS. 3A and 5A). Again, the size/diameter of the nanoparticle 22 shown in FIG. 3A (at a first predetermined time) is smaller than the size/diameter of the nanoparticle 22 shown in FIG. 5A.

As depicted in FIG. 5A, the nanoparticle 22 may initially position itself or grow so that it is adjacent the bottom electrode 12 (shown in FIG. 5A) or the top electrode 14. The nanoparticle 22 in this embodiment shortens the initial tunneling gap $G_I$ into a smaller segment $G_3$, thereby increasing the electron tunneling across the junction. FIG. 5B illustrates the expected current versus voltage results for the device shown in FIG. 5A, which has had voltage applied for a second predetermined time. As shown, the current to voltage characteristics are substantially non-linear, and the current increases as the forward bias increases.

It is to be understood that electron tunneling may be controlled in the embodiments of the switching device 10 disclosed herein. Generally, controlling an increase in electron tunneling is accomplished by forming the metal nanoparticle (s) 22 in a portion of a junction between the electrodes 12, 14 (as previously described). Furthermore, the tunneling may be tuned by controlling the size of the nanoparticle(s) 22 (e.g., by varying the forward bias applied to the device 10). Controlling a decrease in electron tunneling is accomplished by reforming/substantially reforming the metal oxide layer 18, which increases the tunneling gap back/substantially back to the height of the initial tunneling gap $G_I$. It is to be understood that, as defined herein, the reforming of the metal oxide layer 18 and the increasing of the tunneling gap back to the initial tunneling gap $G_I$ are meant to be broadly construed so as to encompass some variation in the thickness/size/shape of the metal oxide layer 18 and some variation in the size of the initial tunneling gap $G_I$.

Reforming the metal oxide layer 18 may be accomplished by applying a reverse bias between the electrodes 12, 14. Generally, the reverse bias will have an opposite effect and will cause the following reactions to take place:

$$EMO_2 + 2H_2O \rightarrow EM + 4e^- + 4OH^- \qquad \text{(Eqn. 3)}$$

where the metal oxide ($EMO_2$) formed from the electrode metal (EM) reacts with water to reform the electrode (EM), electrons, and hydroxide ions ($OH^-$); and

$$M + 2OH^- \rightarrow MO + H_2O - 2e^- \qquad \text{(Eqn. 4)}$$

where the metal nanoparticle (M) reacts with the hydroxide ions to reform the metal oxide layer (MO) and water.

Figure 6B:
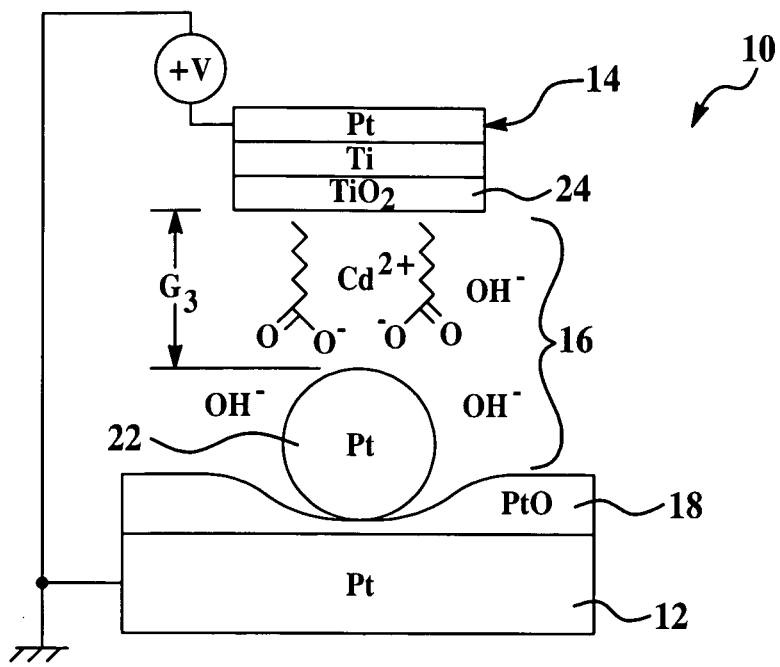
FIG. 6B is a schematic diagram of the switching device of FIG. 6A after a forward bias is applied.
Figure 6C:
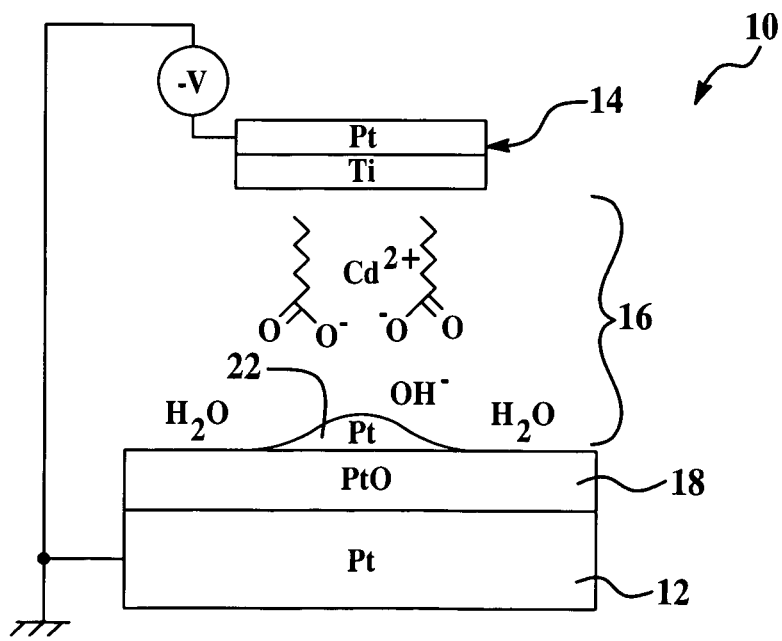
FIG. 6C is a schematic diagram of the switching device of FIG. 6B after a reverse bias is applied.

Referring now to FIGS. 6A through 6C, a non-limitative example of the switching device 10 is schematically depicted as built, when a forward bias is applied, and when a reverse bias is applied, respectively.

FIG. 6A illustrates the device 10 prior to application of any bias. The bottom electrode 12 is platinum, and the metal oxide layer 18 established thereon is platinum oxide. The top electrode 14 includes a layer of platinum and a layer of titanium. In this non-limitative example, the molecular layer 16 includes steric acid as the monolayer of organic molecules. As this is a fatty acid, the molecular layer 16 also includes cadmium cations. A layer of water molecules is also present in the molecular layer 16.

FIG. 6B illustrates the device 10 upon the introduction of the forward bias. As depicted, the oxidation reaction occurs near the top electrode 14, thereby forming a conductive oxide 24 (e.g., titanium oxide). The reduction reaction between the platinum oxide layer 18 and the water molecules forms the platinum nanoparticle 22 and hydroxide ion(s). The formation of the nanoparticle 22 decreases the initial tunneling gap $G_I$ to a smaller segment $G_3$. It is to be understood that electron tunneling is substantially enhanced in this embodiment.

FIG. 6C illustrates the device 10 upon the introduction of a reverse bias. As depicted, the platinum nanoparticle 22 is in the process of reacting with hydroxide ion(s) to reform the platinum oxide layer 18. The water molecules in the molecular layer 16 reform, and the titanium oxide layer 24 near the top electrode 14 reacts with the water molecules to reform the titanium layer of the top electrode 14. As a result of the reformation of the platinum oxide layer 18, the tunneling gap substantially reverts to its initial height, and therefore, electron tunneling substantially decreases.

Figure 7:
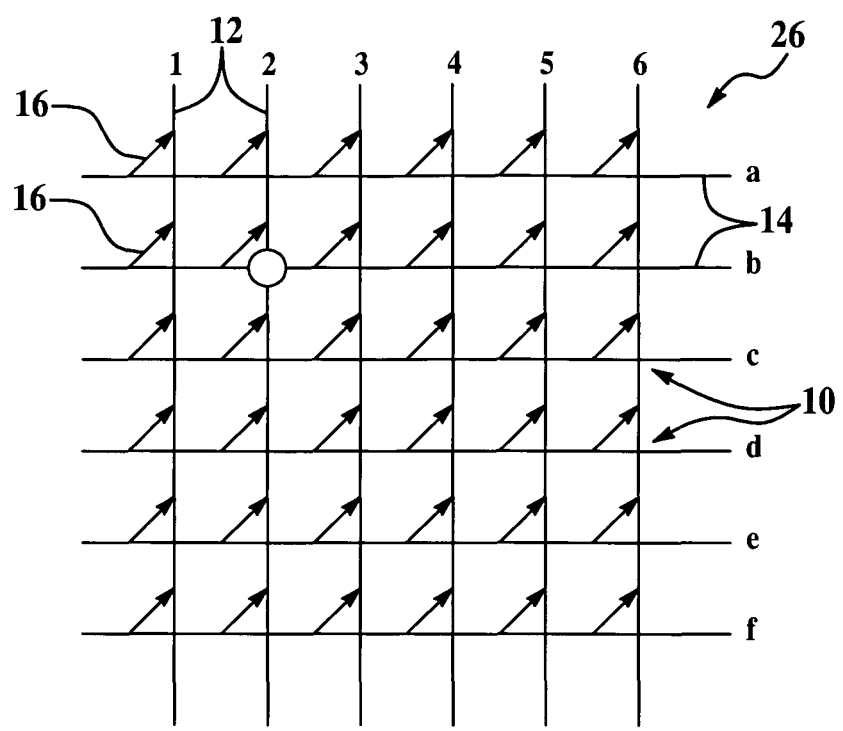
FIG. 7 is a schematic representation of a two-dimensional array of switches, depicting a 6×6 crossbar switch.

Referring now to FIG. 7, the switching device 10 may be replicated in a two-dimensional array to form a plurality/array 26 of switching devices 10 to form a crossbar switch. FIG. 7 depicts a 6×6 array 26. However, it is to be understood that the embodiments herein are not to be limited to the particular number of elements, or switching devices 10, in the array 26. Access to a single point, e.g., 2b, is accomplished by impressing voltage on wires 2 and b to cause a change in the state of the molecular layer 16 at the junction thereof, as described above. Thus, access to each junction is readily available for configuring those that are pre-selected. Details of the operation of the crossbar switch array 26 are further discussed in U.S. Pat. No. 6,128,214, entitled "Molecular Wire Crossbar Memory", issued on Oct. 3, 2000, to Philip J. Kuekes et al., which is incorporated herein by reference in its entirety.

Embodiments of the present disclosure offer many advantages, including, but not limited to the following. Embodiment(s) of the switching device 10 may be used in electronic and/or optical devices. The ability to control the formation and size of the metal nanoparticle 22 advantageously enables control of electron tunneling and tuning at the junction of the device 10. Furthermore, the tunability of the junction advantageously allows the reconfigurability of the device 10, which in turn may have a substantial impact on the implementation of latch logic operation and programmable gate array circuits.

While several embodiments have been described in detail, it will be apparent to those skilled in the art that the disclosed embodiments may be modified. Therefore, the foregoing description is to be considered exemplary rather than limiting.

What is claimed is:

1. A switching device, comprising:
    at least one bottom electrode;
    at least one top electrode, the at least one top electrode crossing the at least one bottom electrode at a non-zero angle, thereby forming a junction;
    a metal oxide layer established on at least one of the at least one bottom electrode or the at least one top electrode;
    a molecular layer established in the junction, the molecular layer including a monolayer of organic molecules and a source of water molecules, whereby upon introduction of a forward bias, the molecular layer facilitates a redox reaction between the at least one bottom electrode and the at least one top electrode; and
    at least one metal nanoparticle formed in a portion of the junction as a result of the redox reaction, thereby reducing a tunneling gap between the at least one bottom electrode and the at least one top electrode.

2. The switching device as defined in claim 1 wherein the reduction portion of the redox reaction forms the at least one metal nanoparticle from the metal oxide layer.

3. The switching device as defined in claim 2 wherein the at least one metal nanoparticle forms adjacent to the at least one top electrode or the at least one bottom electrode.

4. The switching device as defined in claim 2 wherein the at least one metal nanoparticle forms so it is adjacent to neither of the at least one top electrode nor the at least one bottom electrode.

5. The switching device as defined in claim 1 wherein the monolayer of organic molecules includes a fatty acid, and wherein the molecular layer further includes an ion having a charge counter to a charge of the fatty acid.

6. The switching device as defined in claim 5 wherein the ion is selected from cadmium cations, calcium cations, copper cations, zinc cations, mercury cations, and combinations thereof.

7. The switching device as defined in claim 1 wherein the monolayer of organic molecules is selected from aliphatic acids, halogenated aliphatic acid derivatives, mercapto derivatives, phosphate derivatives, mono-chlorosilanones, tri-chlorosilanones, and combinations thereof.

8. The switching device as defined in claim 1 wherein the source of water molecules is selected from water molecules in the molecular layer, an ambient environment, and combinations thereof.

9. The switching device as defined in claim 1 wherein the at least one bottom electrode has the metal oxide layer established thereon, and wherein the oxidation portion of the redox reaction forms a conductive oxide adjacent the at least one top electrode.

10. The switching device as defined in claim 1 wherein the at least one bottom electrode has the metal oxide layer established thereon, and wherein the top electrode has a non-stoichiometric metal oxide layer established thereon so it faces the molecular layer.

11. The switching device as defined in claim 1 wherein the molecular layer has a thickness of less than about 5 nm.

12. A method of forming a switching device, the method comprising:
    establishing a metal oxide layer on at least one of a top electrode or a bottom electrode;
    crossing the top electrode with the bottom electrode at a non-zero angle, thereby forming a junction;
    operatively disposing a molecular layer in the junction, the molecular layer including a monolayer of organic molecules and a source of water molecules, whereby upon introduction of a forward bias, the molecular layer facilitates a redox reaction between the bottom electrode and the top electrode; and
    forming at least one metal nanoparticle in a portion of the junction as a result of the redox reaction, thereby reducing a tunneling gap between the bottom and top electrodes.

13. The method as defined in claim 12 wherein the reduction portion of the redox reaction forms the at least one metal nanoparticle from the metal oxide layer.

14. The method as defined in claim 13 wherein the at least one metal nanoparticle forms adjacent to the at least one top electrode or the at least one bottom electrode, or so it is adjacent to neither the at least one top electrode nor the at least one bottom electrode.

15. The method as defined in claim 13 wherein the at least one bottom electrode has the metal oxide layer established thereon, and wherein the oxidation portion of the redox reaction forms a conductive oxide adjacent the at least one top electrode.

* * * * *